BISTABLE TRIGGER CIRCUIT

Filed March 26, 1962

INVENTORS
RALPH L. WELKEN
LLOYD M. LAMBERT JR.
BY John R. Faulkner
John A. Duffy
ATTORNEYS

United States Patent Office 3,132,265
Patented May 5, 1964

3,132,265
BISTABLE TRIGGER CIRCUIT

Ralph L. Welken and Lloyd M. Lambert, Jr., Santa Ana, Calif., assignors to Ford Motor Company, Dearborn, Mich., a corporation of Delaware Filed Mar. 26, 1962, Ser. No. 182,592
9 Claims. (Cl. 307—88.5)

Figure 1:
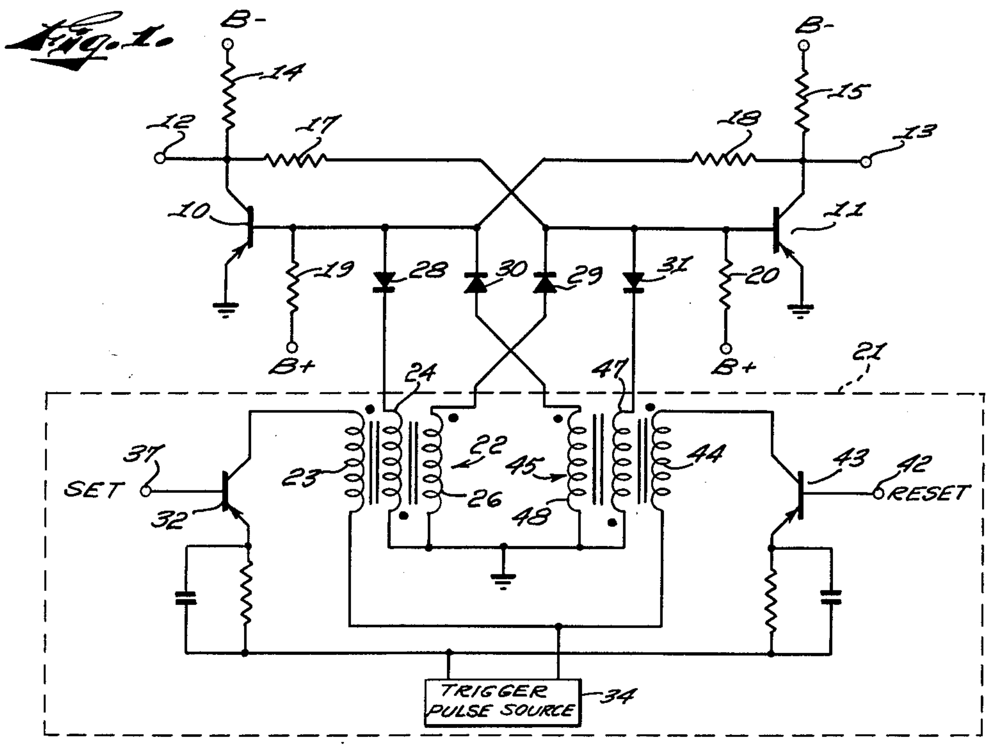

This invention relates to binary trigger circuits and more particularly to a bistable flip flop circuit in which both sides of the circuit are simultaneously driven for each trigger initiating action.

A common and well known circuit used in digital applications such as binary counters is the flip flop. In one form a flip flop may comprise a pair of transistors intercoupled so that when one is conducting the voltage at its output is applied to the input of the other transistor to maintain the latter in a nonconducting state. A signal in the form of a pulse may be applied to one of the transistors of the flip flop and it will remain in this state while providing a signal to maintain the other transistor nonconducting until the latter is similarly pulsed to reverse the conducting-nonconducting relationship.

Circuits of the type described above are extensively used in digital computers and data processors and form the basic component of such apparatus. The increasing need for improved efficiency and speed chracteristics necessitates the search for a basic flip flop circuit of improved characteristics. Unfortunately, prior flip flop circuits applying intercoupled transistors have basic limitations which seriously affect efficiency and speed of associated circuitry. A regeneration circuit is required from the output of each of the transistors to the input of the other in order to provide the flip flop operation. The loop gain of the coupled signal must be maintained at greater than unity. Such circuitry severely limits design loads and time of response of the flip flop circuit since, in operation, when one transistor is turned on by an incoming pulse signal the other transistor must await the coupling signal in order to turn off. Advanced circuit designs have been unable to overcome these limitations. Accordingly, it is an object of this invention to provide a bistable binary circuit of improved design and speed characteristics.

According to a principal aspect of the invention, means are provided for simultaneously controlling the base potentials of a pair of transistors to provide bistable operation. Means including a pair of transformers, each having a primary winding responsively connected to receive a signal for initiating operation to place the bistable circuit in one of the bistable states, are connected to simultaneously apply control signals of opposite polarity to the base electrodes of the flip flop transistors. The control signals alternatively cause one transistor to conduct and the other transistor to cut off, and cause the other transistor to conduct and the one transistor to cut off in accordance with desired flip flop action.

According to a further aspect of the invention, oppositely poled unidirectional coupling means are utilized for coupling the control signals from each of the transformers to the base electrodes of the transistor of the flip flop transistors. In this manner, the input of each of the transistors is connected to receive oppositely poled signals from each of the transformers through the oppositely poled coupling diodes. Time consuming and inefficient coupling between the transistors is not required and each of the transistors is simultaneously turned off and on for each flip flop operation.

It is therefore another object of this invention to provide a bistable trigger circuit in which both states are simultaneously controlled during operation.

It is still another object of this invention to provide a bistable trigger circuit having a pair of transistors which are simultaneously turned off and on.

Figure 2:
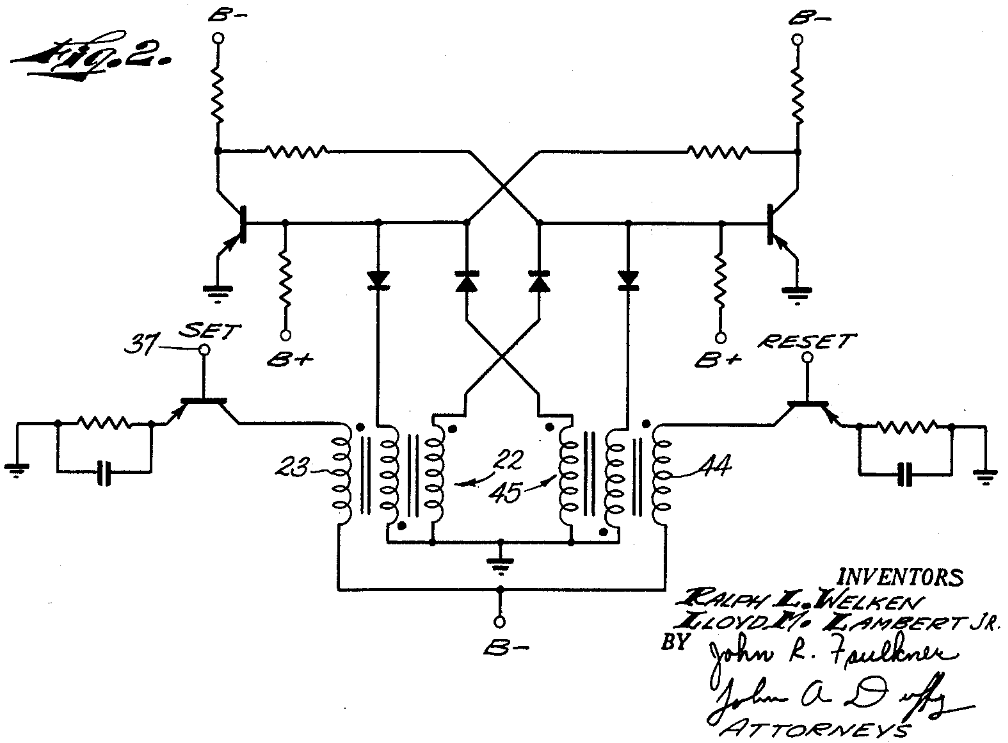

Other objects of invention may be better understood by reference to the drawings taken with the description, in which:

FIG. 1 is a schematic circuit diagram illustratng a principal aspect of the invention, and FIG. 2 is an alternative aspect of the arrangement shown in FIG. 1.

The efficiency and high speed of operation which provide the improved bistable circuit of the invention are derived from the use of a transformer coupled trigger circuit which simultaneously controls the base potentials of a pair of transistors to achieve flip flop operation. Each transformer has a primary winding adapted to receive a set-reset signal and has a pair of oppositely poled secondary windings coupled through similarly oppositely poled diodes to the base electrodes of the flip flop transistors. Upon receipt of a pulse at one of the transformers, pulses of opposite polarity are coupled through the secondary windings of the transformer to cause one transistor to conduct and the other transistor to nonconduct for flip flop operation.

Referring now to the drawings and in particular to FIG. 1, there is illustrated a bistable trigger circuit of the invention in which transistors 10 and 11 operate as a flip flop with the transistor 10 being designated as the one transistor, and the transistor 11 being designated as the zero transistor in accordance with binary terminology. Also, for purposes of description, the flip flop may be considered to be in the one state when the one transistor 10 is conducting and in the zero state when the zero transistor 11 is conducting. Output signals may be taken at either of the terminals 12 and 13 at the collector electrodes of the transistors 10 and 11 respectively to indicate the state of the flip flop. The transistors 10 and 11 may be of the PNP type, their respective emitter electrodes connected to receive an intermediate potential called ground from a D.C. source and their collector electrodes respectively connected through resistors 14 and 15 to the B— terminal of the D.C. source. Resistors 17 and 18 are connected between the respective collectors and bases of the transistors 10 and 11. Resistors 19 and 20 respectively provide a connection to the B+ terminal of the D.C. source from the base electrodes of transistors 10 and 11.

The transistors 10 and 11 do not operate as a bistable circuit in the conventional manner because of interconnections between the transistors, but receive control potentials at both of their base electrodes from a trigger circuit indicated generally at 21. Trigger control potentials are applied to the base of the transistor 10 through a transformer-coupled trigger circuit which includes the transformer 22 having a primary winding 23 and a pair of oppositely poled secondary windings 24 and 26. A diode, having its anode electrode connected to the base of the transistor 10 and its cathode electrode connected to one side of the secondary winding 24 with the other side of the winding 24 connected to ground, couples a negative pulse to the base of the transistor 10 upon actuation of the primary winding 23. A diode 29 having its cathode connected to the base of the transistor 11 and its anode connected to one side of the secondary winding 26 with the other side of the winding 26 being connected to ground couples a positive pulse to the base electrode of a transistor 11 upon actuation of the winding 23. The primary winding 23 has one end connected through a transistor switch 32 to one side of a trigger pulse source 34, and its other end connected to the other side of the pulse source 34. The transistor 32 is adapted to receive a set signal from the terminal 37 at its base which turns the transistor 32 on completing a circuit through the primary winding 23 upon coincidence with a clock signal from the pulse source 34. Thus, in digital circuit terminology, a set signal at the terminal 37 will place the flip flop of the transistors 10 and 11 in the one state. Similarly, a reset signal applied to the terminal 42 will cause conduction in a transistor switch 43 upon coincidence with a signal from the trigger pulse source 34. A transformer 45 has a primary winding 44 connected in series between the transistor switch 43 and one side of the trigger pulse source 34 and a pair of oppositely poled secondary windings 47 and 48. A diode 30 having its cathode connected to the base of the transistor 10 and its anode connected to one side of the secondary winding 48 with the other side of the secondary winding 48 being connected to ground couples a positive pulse to the base of the transistor 10. A diode 31 having its anode connected to the base of the transistor 11 and its cathode connected to one side of the secondary winding 47 with the other side being connected to ground couples a negative pulse to the base of the transistor 11 upon conduction in the transistor 43.

In operation, the flip flop of the transistors 10 and 11 is responsive to digital set signals from the terminal 37 and reset signals from the terminal 42 to place the flip flop in the one and zero state. Upon receipt of either a set signal at the terminal 37 or a reset signal at the terminal 42 in coincidence with a clock signal from the pulse source 34, transistors 10 and 11 simultaneously receive control potentials at their respective base electrodes to cause conduction and nonconduction in accordance with the set or reset signal. For example, assuming initially the flip flop to be in the zero state with the transistor 11 conducting and the transistor 10 cutoff, a set signal at the terminal 37 in coincidence with a clock signal from the pulse source 34 causes conduction in the primary winding 23 of the transformer 22. The secondary winding 24 conducts, coupling a negative pulse through the diode 28 to the base of the transistor 10, causing conduction therein. Simultaneously, the secondary winding 26 couples a positive pulse through the diode 29 to the base of the transistor 11 causing nonconduction therein. The simultaneous application of signals from the oppositely poled secondary windings through the diodes 28 and 29 causes the flip flop to change states with the flip flop now in the one state with the transistor 10 conducting and the transistor 11 cutoff. Now if a reset signal is then applied to the terminal 42 in coincidence with a signal from a pulse source 34 there is caused conduction in the transformer 45 with the secondary winding 47 imparting a negative pulse through the diode 31 to the base of the transistor 11 to cause conduction therein and the secondary winding 48 imparting a positive pulse through the diode 30 to the base of the transistor 10 turning the transistor off. Transistors 10 and 11 are simultaneously controlled with the transistor 11 conducting the transistor 10 cutoff with the flip flop now in the zero state.

Thus, it may be seen that upon application of a set signal at the terminal 37, transistors 10 and 11 simultaneously receive control signals from the transformer 22 to provide flip flop operation. Similarly, a reset signal at the terminal 42 simultaneously causes conduction and nonconduction in transistors 10 and 11. The provision of oppositely poled secondary windings simultaneously coupling positive and negative control signals to alternately cause conduction and nonconduction in the transistors 10 and 11 provides a flip flop circuit which meets the requirements for high speed digital operation. The push pull operation of each of the transformer trigger circuits provides the entire control for the flip flop for the transistors 10 and 11. The transistors are not dependent on cross coupling signals from the output of the transistors which result in a delay in time.

Referring now to FIG. 2, there is shown an alternative embodiment of the invention in which an application of a set signal to the terminal 37 will cause the flip flop to be placed in the one state without a necessity of coincidence from a trigger pulse source. In the embodiment of FIG. 2 the primary winding 23 of the transformer 22 is connected directly to the B— terminal of the D.C. source with the primary winding 44 of the transformer 45 similarly connected. Thus, upon application of a signal from the terminal 37 to cause conduction in the primary winding 23 of the transformer 22 a current flows from the ground terminal to the B— terminal through the winding 23. The circuit of FIG. 2 may be adapted to comprise one stage of a set-reset binary counter.

Although the invention has been described and illustrated in detail, it is to be clearly understood that the same is by way of illustration and example only, and is not to be taken by way of limitation, the spirit and scope of this invention being limited only by the terms of the appended claims

We claim:

1. In a binary circuit having a pair of transistors,
means for interconnecting said transistors for flip flop operation comprising,
a pair of transformers,
each of said transformers having a primary winding and a pair of oppositely poled secondary windings,
means connecting one secondary winding of each said transformer to the input of one of said transistors and the other secondary winding of each said transformer to the input of the other said transistor,
whereby the input of each said transistor is connected to receive oppositely poled signals from said transformers.

2. The combinattion recited in claim 1 wherein
said last mentioned means comprises unidirectional circuit means connecting said secondary windings to the input of said transistors to pass signals of a single polarity.

3. The combinaion recited in claim 1 wherein said transistors are of the same polarity type.

4. In a bistable circuit having a pair of transistors of the same polarity type,
means for simultaneously controlling the base potentials of said transistors to provide bistable operation comprising,
means including a pair of transformers for simultaneously applying control signals of opposite polarity to the bases of said transistors,
one of said transformers having a primary winding responsively connected to receive a set signal for initiating operation to place said bistable circuit in one of said bistable states,
the other of said transformers having a primary winding responsively connected to receive a reset signal for initiating operation to place said bistable circuit in the other of said bistable states,
each of said transformers having secondary winding means for simultaneously controlling the base of potential of said transistors upon application of said set and reset signals.

5. The combination recited in claim 4 wherein said secondary winding means for each said transformer comprises a pair of oppositely poled secondary windings,
means for coupling are of said secondary windings to the base of one of said transistors,
and means for coupling the other said secondary winding to the base of the other said transistor.

6. The combination recited in claim 5 wherein said coupling means comprises a diode.

7. In a circuit having a pair of transistors for indicating two bistable outputs,
means for simultaneously applying signals of opposite polarity to the base electrodes of said transistors to provide bistable operation comprising,
a pair of transformers,
each said transformer having primary winding, means responsively connected to receive a signal for initiating operation to provide one of said bistable outputs, and each said transformer having secondary winding means for simultaneously coupling the signal received by said primary winding to said base electrodes.

8. The combination recited in claim 7 wherein each said secondary winding means comprises a pair of oppositely poled secondary windings, and means for coupling one of said secondary windings to one of said base electrodes and coupling the other of said secondary windings to the other of said base electrodes.

9. The combination recited in claim 8 wherein said coupling means comprise a diode.

No references.